United States Patent [19]

Gillery

[11] Patent Number: 4,920,006

[45] Date of Patent: Apr. 24, 1990

[54] COLORED METAL ALLOY/OXYNITRIDE COATINGS

[75] Inventor: Frank H. Gillery, Allison Park, Pa.

[73] Assignee: PPG Industries, Inc., Pittsburgh, Pa.

[21] Appl. No.: 31,315

[22] Filed: Mar. 26, 1987

[51] Int. Cl.⁵ .............................................. B32B 15/00
[52] U.S. Cl. .................... 428/432; 428/701; 428/702
[58] Field of Search ................. 428/432–434, 428/701, 702, 426

[56] References Cited

U.S. PATENT DOCUMENTS

| | | | |
|---|---|---|---|
| 3,990,784 | 11/1976 | Gelber | 350/166 |
| 4,022,947 | 5/1977 | Grubb et al. | 428/432 |
| 4,450,201 | 5/1984 | Brill et al. | 428/432 X |
| 4,534,841 | 8/1985 | Hartig et al. | 204/192 |
| 4,535,000 | 8/1985 | Gordon | 427/160 |
| 4,546,050 | 10/1985 | Amberger | 428/630 |

*Primary Examiner*—Nancy A. B. Swisher
*Attorney, Agent, or Firm*—Donna L. Seidel

[57] ABSTRACT

A multiple-layer architectural coating comprising titanium oxynitride and a metal film is disclosed, as well as a method for its production.

10 Claims, 3 Drawing Sheets

COLORED METAL ALLOY/OXYNITRIDE COATINGS

BACKGROUND OF THE INVENTION

The present invention relates generally to the art of sputtering metal-containing films on non-metallic substrates, and more particularly to the art of magnetic sputtering of multiple-layer metal dielectric transparent films on glass.

U.S. Pat. No. 3,990,784 to Gelber discloses a coated architectural glass system comprising a transparent substrate and a multi-layer coating composition first and second metal layers with a dielectric layer between them, wherein the first and second metal layers have a thickness ratio so that the transmission of the coating can be changed independent of its reflection properties by varying the thickness of the metal layers while maintaining the ratio constant. The dielectric has a thickness such that the reflection from the coating is not strongly colored.

U.S. Pat. No. 4,022,947 to Grubb et al. discloses a transparent panel capable of transmitting a desired portion of visible radiation while reflecting a large portion of incident solar radiation and a method of preparing same, by sputtering an iron, nickel and chromium alloy to obtain a transparent metal film, and reactively sputtering the same or a similar alloy in the presence of oxygen to form an oxide film. In one preferred embodiment, the metal film lies between the substrate and the metal oxide film. In another preferred embodiment, the metal oxide film lies between the substrate and the metal film.

U.S. Pat. No. 4,534,841 to Hartig et al. discloses solar-control glazing produced by applying first an oxide layer having an optical thickness of 20 to 280 nanometers to a transparent substrate by cathodic evaporation and second a chromium nitride layer having a geometric thickness of 10 to 40 nanometers. An optical third dielectric layer may be applied to the second layer. The oxide layer is selected from oxides of tin, titanium and aluminum.

U.S. Pat. No. 4,535,000 to Gordon discloses placing a thin film of metal nitride, e.g. titanium nitride, on a glass substrate by mixing a metal halide with a reducing gas like ammonia at 250° to 320° C. and reacting the gases at the glass surface heated to 400° to 700° C. to form the film on the glass.

U.S. Pat. No. 4,546,050 to Amberger et al discloses a glass sheet with a multilayer coating selected from the group consisting of copper, stainless steel, titanium dioxide; copper, titanium, titanium dioxide; and copper, titanium, titanium nitride.

Architectural glass products with metallic and/or metal oxide films are growing in importance as energy demands for heating and cooling become increasingly expensive. Coated glass architectural products generally fall into two categories, solar energy control and high transmittance, low emissivity coated products.

Solar energy control glass products are generally glass substrates, often tinted, coated with a low visible transmittance colored film which reduces solar energy transmittance through the windows into the building interior, thereby reducing air conditioning costs. These products are most effective in warm climates and are most often seen in commercial construction. In areas where heating costs are of greater concern, and particularly in residential construction, high transmittance, low emissivity coatings are desirable in order to allow high transmittance of visible light into the interior while reflecting infrared radiation to retain heat inside the building. High transmittance, low emissivity coatings are typically multiple layer films wherein an infrared reflecting metal such as silver, gold or copper is sandwiched between anti-reflective metal oxide layers such as bismuth, indium and/or tin oxides. Solar energy control films, on the other hand, are typically single layer films of one or more metals or oxides of metals such as cobalt, iron, chromium, nickel, copper, etc.

Wet chemical methods for producing metallic films for solar energy control are well known from U.S. Pat. Nos. 3,846,152; 4,091,172; 3,723,158 and 3,457,138. Pyrolytic methods for producing metal oxide films for solar energy control are well known from U.S. Pat. Nos. 3,660,061; 3,658,568; 3,978,272 and 4,100,330.

Sputtering technologies for producing high transmittance, low emissivity multiple layer coatings are disclosed in U.S. Pat. No. 4,462,884 and No. 4,508,789. Sputtering techniques for producing solar control films are disclosed in U.S. Pat. No. 4,512,863 and No. 4,594,137.

SUMMARY OF THE INVENTION

The present invention provides a novel and superior dielectric film for use in a wide variety of multiple-layer architectural coatings on glass. The present invention involves sputtering a titanium cathode in an atmosphere comprising oxygen and nitrogen in order to deposit a coating comprising titanium oxynitride. The titanium oxynitride film of the present invention is deposited in combination with a metal alloy film such as stainless steel or Inconel to form a variety of colored multi-layer coatings with relatively saturated colors.

DESCRIPTION OF THE PREFERRED EMBODIMENTS

Figure 1:
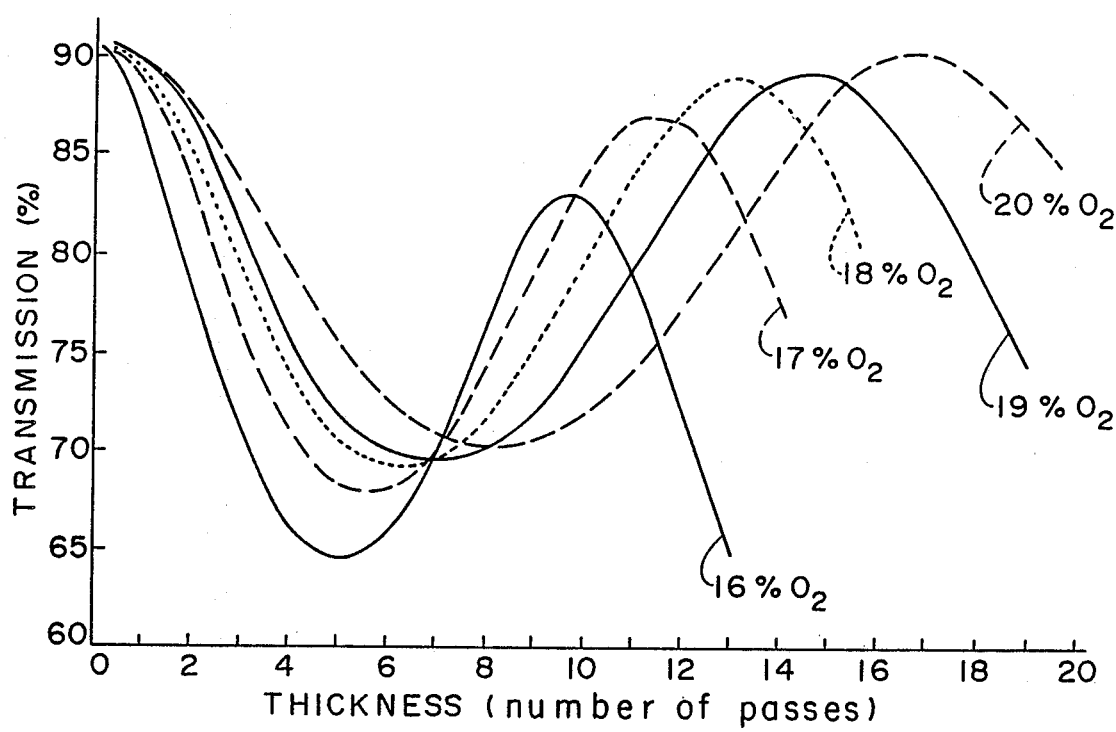
FIG. 1 illustrates the transmittance of a titanium oxynitride film as a function of film thickness, measured in number of cathode passes, for various percentages of oxygen in nitrogen.
Figure 2:
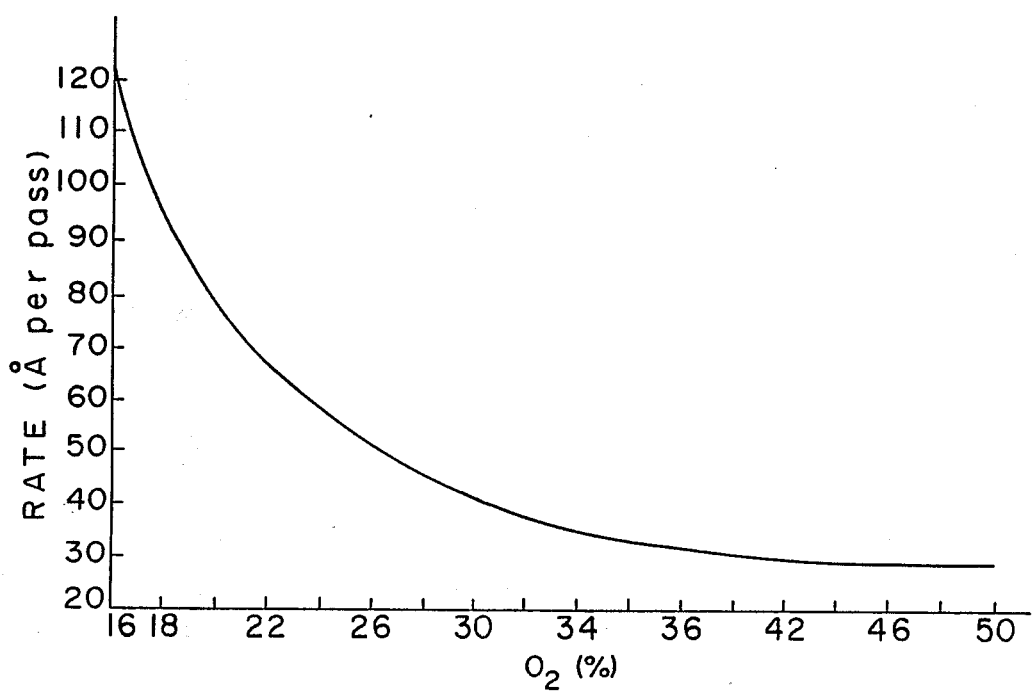
FIG. 2 illustrates the deposition rate of titanium oxynitride, in Angstroms per cathode pass, as a function of the percentage of oxygen in the atmosphere of the coating chamber.
Figure 3:
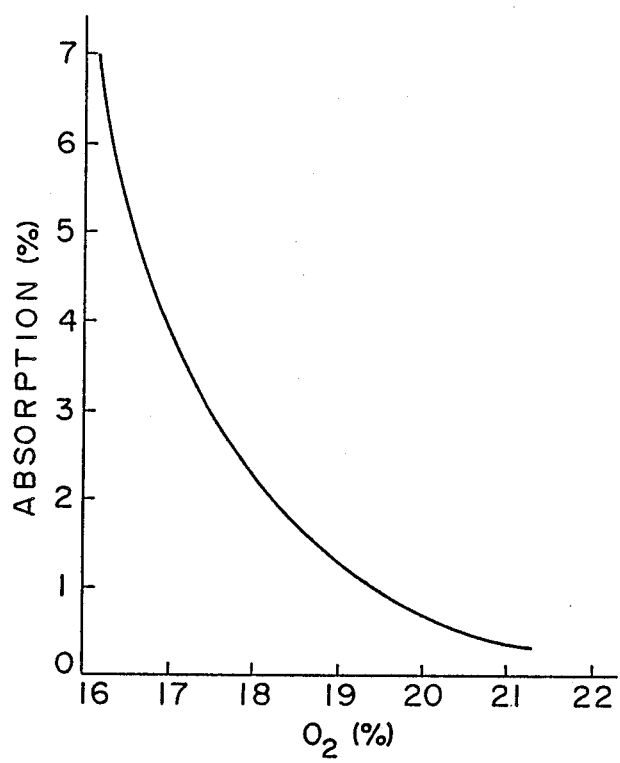
FIG. 3 illustrates the absorption of a quarter wavelength (about 600 Angstroms thick) titanium oxynitride film as a function of the percentage of oxygen in the atmosphere of the coating chamber.
Figure 4:
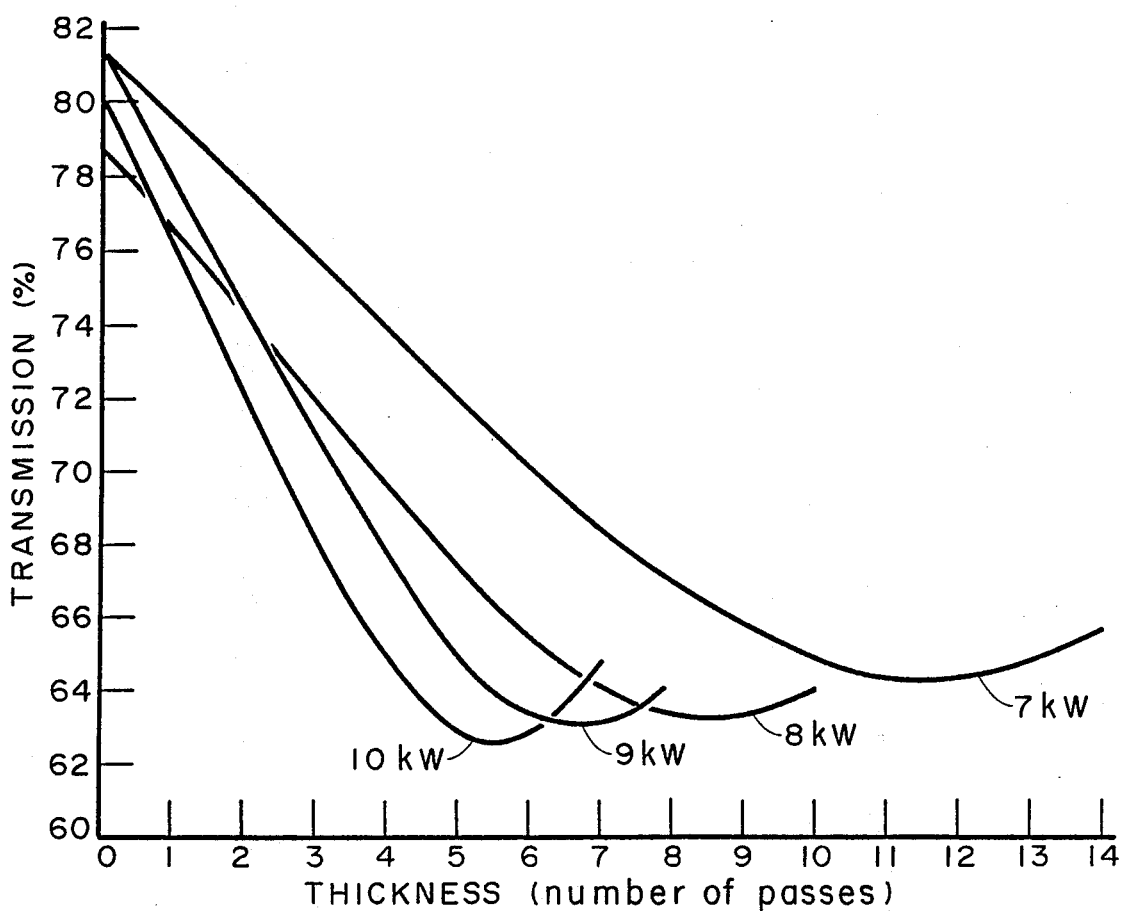
FIG. 4 illustrates the transmittance of a titanium oxynitride film over an Inconel film as a function of film thickness at various cathode power levels.

The present invention provides the capability of making a series of colored coatings with a minimum of layers and materials. The coating system of the present invention has relatively low reflection, high color saturation and monolithic durability.

It is known that a color series can be made with first and second metal layers surrounding a layer of a transparent dielectric material; the color being varied by changing the thickness of the dielectric layer. However, no previously practiced dielectric had the required properties of fast sputtering, high index and good durability. The titanium oxynitride of the present invention has the above properties, as well as the ability, in combination with a suitable metal film, to produce intensely colored architectural coatings. For example, titanium oxynitride in combination with a nickel alloy can be used to make a range of attractive colors with excellent durability.

Using reflectance circle diagrams and computer calculations, it is determined that a two layer combination of metal and dielectric has an optimum thickness for both layers which gives the minimum reflectance and highest color saturation combination. The higher the refractive index of the dielectric, the lower the transmittance of the coating at the optimum, and the higher the color saturation. Metals with low n and high k, where n and k are the real and complex parts of the complex refractive index, defining the propagation of electromagnetic radiation in the medium, tend to give the lowest transmission and highest saturation.

If the thickness of the metal is increased in an attempt to lower the transmission, the reflectance is increased and a weak color results. Depositing a very thin metal layer prior to the deposition of the dielectric layer can decrease the reflectance and give a more saturated color. If the thickness of the primary metal layer is increased in combination with the deposition of a very thin metal layer, a low transmitting, low reflectance, highly colored coating can be produced. If two primary metal layers are used, a low refractive index dielectric in combination with a low n, high k, metal gives the most attractive appearance. The calculations show that at 20 percent light transmission, adequate saturation can be obtained using a metal in combination with a dielectric with a refractive index of 2.3. For lower light transmission, a metal-dielectric-metal system is preferred.

With the titanium oxynitride of the present invention, many metal or metal alloy films can be used to provide a multiple-layer coating with good properties. Preferred films include metals such as titanium, and metal alloys such as nickle alloys and iron alloys. A nickel alloy is preferred since it is highly chemical resistance, neutral in color and easy to deposit.

In a conventional magnetron sputtering process, a substrate is placed within a coating chamber in facing relation with a cathode having a target surface of the material to be sputtered. Preferred substrates in accordance with the present invention include glass, ceramics and plastics which are not detrimentally affected by the operating conditions of the coating process.

The cathode may be of any conventional design, preferably an elongated rectangular design, connected with a source of electrical potential, and preferably employed in combination with a magnetic field to enhance the sputtering process. The anode is preferably a symmetrically designed and positioned assembly as taught in U.S. Pat. No. 4,478,702 by Gillery et al, the disclosure of which is incorporated herein by reference.

A clean glass substrate is placed in a coating chamber which is evacuated, preferably to less than $10^{-4}$ torr, more preferably less than $2 \times 10^{-5}$ torr. A selected atmosphere of reactive gases, preferably nitrogen and oxygen, is established in the chamber to a pressure between about $5 \times 10^{-4}$ and $10^{-2}$ torr. A cathode having a target surface of titanium is operated over the surface of the substrate to be coated. The target metal is sputtered, reacting with the atmosphere in the chamber to deposit a titanium oxynitride coating layer on the glass surface. The figures show that the properties of a titanium oxynitride film change gradually and continuously as the gas composition changes. In contrast, titanium sputtered in an oxygen/argon mixture exhibits an abrupt change from oxide to metal. Further, the figures show that it is possible to select sputtering conditions such that a titanium oxynitride film of desired transmittance and absorbance can be deposited at a preferred sputtering rate.

After the initial layer of titanium oxynitride is deposited, the coating chamber is evacuated, and an inert atmosphere such as pure argon is established at a pressure between about $5 \times 10^{-4}$ and $10^{-2}$ torr. A cathode having a target surface of metal or metal alloy is operated over the titanium oxynitride coated surface. The target is sputtered to deposit a metallic layer on the titanium oxynitride coated glass surface. A preferred metal is titanium. Preferred metal alloys include Inconel, a nickel alloy, and stainless steel, an iron alloy, preferably sputtered at a pressure of 4 to 6 millitorr in pure argon.

In some preferred embodiments of the present invention, a metal film is deposited under, as well as over, the titanium oxynitride film. As in the case of a two layer film, the dominant wavelength of the reflected color from the uncoated surface depends almost totally on the thickness of the titanium oxynitride layer. The thickness of the top metal layer is varied until the transmission has about the required value, then the thickness of the underlying metal layer is varied until the desired reflection from the uncoated side of the article is attained. Final modification of the top metal film thickness may be required to obtain the optimum final transmission. Within the thickness range of interest, increasing the thickness of the top metal film decreases the transmission and increases the reflectance from the uncoated side of the coated article. Increasing the thickness of the bottom metal film decreases the transmission and decreases the reflectance from the uncoated side.

The present invention will be further understood from the descriptions of specific examples which follow.

EXAMPLE I

A multiple layer coating of titanium oxynitride and nickel alloy is deposited on a glass substrate under the following conditions. A clean glass substrate is maintained in a vacuum chamber in an atmosphere of 15 percent oxygen and 85 percent nitrogen at a pressure of 6 millitorr. With a titanium cathode powered at 6.7 kilowatts and a line speed of 120 inches (about 3 meters) per minute, eight passes are required to produce a titanium oxynitride coating at a thickness having first order blue color. The titanium oxynitride coated glass surface is then passed under a nickel alloy target in pure argon. The nickel alloy in this example is Inconel 625, which comprises 18.6 percent chromium, 3 percent iron, 4 percent columbium, 9 percent molybdenum and the balance nickel. A layer of nickel alloy is sputtered to a sufficient thickness to reduce the transmittance to 22 percent. The chromaticity coordinates of this coating are $x = 0.3198$ and $y = 0.2863$ in reflectance from the uncoated glass surface. The observed color is purplish-pink and the luminous reflectance is 5.65 percent from the uncoated glass surface.

EXAMPLE II

Using the layer system titanium oxynitride-Inconel as in Example I, a coating with about 20 percent luminous transmittance and an attractive blue color is produced under the conditions given in Table I. Color control of the two layer coating is simple. The thickness of the titanium oxynitride controls the hue. If it is too green, the layer is too thick. If it is too red, the layer is too thin. The thickness of the titanium oxynitride also affects the transmission (or reflectance) since reddish-blue coatings generally have higher transmission than greenish-blue coatings. However, once the hue is fixed, the transmission (or reflectance) can be adjusted by changing the thickness of the Inconel layer. As would be expected, increasing the thickness decreases the transmittance and increases the reflectance. This change has an insignificant effect on the dominant wavelength of the hue. The effects of layer thickness changes, expressed as percentages of the coating thickness produced by conditions in Table I, on the color of five two-layer coatings of this example are presented in Table II.

TABLE I

Typical Deposition Conditions for Two Layer Blue Coating at 20 Percent Transmittance

| Condition | First Layer | Second Layer |
| --- | --- | --- |
| Film Composition | Titanium Oxynitride | Nickel Alloy |
| Target Metal | Titanium | Inconel 625 |
| Gas Mixture (volume percent) | 81 nitrogen 19 oxygen | 100 argon |
| Pressure (millitorr) | 4 | 4 |
| Power (kilowatts) | 10 | 1.53 |
| Volts | 637 | 424 |
| Target Size (inches) | 5 × 17 | 5 × 17 |
| Conveyor Speed (inches/minute) | 120 | 120 |
| Final Transmission (percent at 500 nanometers) | 71.6 | 19.4 |

TABLE II

Variation of Color Coordinates with Change in Layer Thickness - 2 Layer Coating

| Sample | Relative Layer Thickness Oxynitride/ Metal | Reflectance from the Uncoated Surface Y | x | y | Luminous Transmittance (percent) | Color |
| --- | --- | --- | --- | --- | --- | --- |
| 2-1001 | 100/100 | 11.5 | .2284 | .2453 | 19.4 | blue |
| 2-1002 | 120/100 | 11.12 | .2280 | .2442 | 18.3 | blue |
| 2-1003 | 83/100 | 17.08 | .2459 | .2834 | 21.3 | greenish-blue |
| 2-1005 | 100/83 | 9.93 | .2266 | .2430 | 23.2 | blue |
| 2-1006 | 100/120 | 14.13 | .2345 | .2559 | 16.1 | blue |

EXAMPLE III

A glass substrate is sputter coated as in the previous examples with a first layer of Inconel 625 to luminous transmittance of 60 percent. A titanium oxynitride film is sputtered over the nickel alloy as in the previous examples. A second nickel alloy film is deposited to a final luminous transmittance of 22 percent. The chromaticity coordinates of coating are x=0.2644 and y=0.2340 from the glass surface. The observed color is violet and the luminous reflectance is 8.9 percent from the uncoated glass surface.

EXAMPLE IV

A series of three-layer coatings is prepared by varying the thicknesses of the individual titanium oxynitride and Inconel layers. The results of these examples are presented in Table 4, wherein the thicknesses are expressed as percentages of the thicknesses obtained using the conditions stated above in Table 3.

TABLE III

Typical Deposition Conditions for 3-Layer Blue Coating at 12 percent Transmittance

| Condition | First Layer | Second Layer | Third Layer |
| --- | --- | --- | --- |
| Target Metal | Inconel 625 | Titanium | Inconel 625 |
| Gas Mixture (volume percent) | 100 argon | 81 nitrogen/ 19 oxygen | 100 argon |
| Pressure (millitorr) | 4 | 4 | 4 |
| Power (kilowatts) | 00.4 | 10 | 2.11 |
| Volts | 285 | 637 | 432 |
| Target Size (inches) | 5 × 17 | 5 × 17 | 5 × 17 |
| Conveyor Speed | 120 | 120 | 120 |
| Final Transmission (percent at 500 nanometers) | 72.8 | 62.9 | 12.3 |

TABLE IV

VARIATION OF COLOR COORDINATES WITH CHANGE IN LAYER THICKNESSES - 3 LAYER COATING

| | Relative Coating Thickness | | | Reflectance from the Uncoated Surface | | | |
| --- | --- | --- | --- | --- | --- | --- | --- |
| Sample | Bottom Metal | Oxy-nitride | Top Metal | Y | x | y | Color |
| 2-933 | 100 | 100 | 133 | 17.48 | .2427 | .2527 | blue |
| 2-928 | 100 | 100 | 117 | 15.69 | .2306 | .2661 | greenish/blue |
| 2-923 | 100 | 100 | 100 | 14.44 | .2237 | .2664 | blue |
| 2-929 | 100 | 100 | 83 | 11.43 | .2234 | .2357 | blue |
| 2-934 | 100 | 100 | 67 | 9.00 | .2206 | .2248 | blue |
| 2-926 | 100 | 117 | 100 | 22.16 | .2472 | .2853 | greenish//blue |
| 2-923 | 100 | 100 | 100 | 14.44 | .2237 | .2444 | blue |
| 2-927 | 100 | 83 | 100 | 7.46 | .2710 | .2436 | violet |
| 2-943 | 0 | 100 | 100 | 13.75 | .2367 | .2492 | blue |
| 2-944 | 50 | 100 | 100 | 11.97 | .2386 | .2422 | blue |
| 2-945 | 100 | 100 | 100 | 11.36 | .2252 | .2302 | blue |
| 2-946 | 150 | 100 | 100 | 8.92 | .2143 | .2084 | blue |
| 2-947 | 200 | 100 | 100 | 8.49 | .2048 | .2013 | blue |

EXAMPLE V

A titanium oxynitride film is deposited on a glass surface as in Example I. A stainless steel film is deposited over the titanium oxynitride. The chromaticity coordinates of this coating are x=0.2466 and y=0.2680 from the glass surface. The observed color is greenish-blue and the luminous reflectance is 18.5 percent from the uncoated glass surface.

EXAMPLE VI

A titanium oxynitride film is deposited in 8 passes on a glass surface as in the previous examples. A titanium metal film is deposited by sputtering a titanium cathode in argon. The chromaticity coordinates of the coating are x=0.3317 and y=0.3037 from the glass surface. The observed color is purplish-pink and the luminous reflectance is 5.17 percent from the uncoated glass surface.

EXAMPLE VII

A titanium oxynitride film is deposited in 9 passes on a glass surface as in Example VI. A titanium metal film is deposited by sputtering a titanium cathode in argon. The chromaticity coordinates of the coating are x=0.2402 and y=0.2265 from the glass surface. The observed color is purplish-blue and the luminous reflectance is 5.32 percent from the uncoated glass surface.

The above examples are offered to illustrate the advantages of the present invention. The coatings in Tables II and III are not attacked in 24 hours by cold 20 percent hydrochloric acid or cold 30 percent nitric acid. In the five hour 275° F. (135° C.) heat test, there is a small transmittance change and a small reflected color change. This would be consistent with a growth of protective oxide on the Inconel surface, a process which should be self-limiting.

In the Cleveland condensing humidity test at 150° F. (about 66° C.), no change was observed in the coatings in four months. The coatings are not affected by abrading with a pencil eraser, nor by the cycling bristle brush test, used to evaluate the coatings for internal monolithic glazing. However, rubber with wet or dry pumice shows that the coating is not as hard as coatings comprising titanium nitride.

The titanium oxynitride/metal alloy combination of layers can produce a few attractive products. However, the metal/titanium oxynitride/metal system can produce a much broader range of reflectance colors and transmissions using only two materials. Titanium oxynitride is transparent, chemically resistant, has a high-index of refraction and is as fast to deposit as the oxides of tin and zinc, which have inferior properties. The concentration of oxygen in nitrogen is not as critical to the process as might be thought unless the deposition rate is pushed to its absolute maximum. This relieves the complication that in-machine monitors are only reliable in the transmission mode which cannot distinguish a decrease in transmission from an increase in film thickness from a decrease in transmission due to an increase in absorption. Thus, color control for the two-layer coating should not be difficult. Color control is slightly more complicated for the three layer coating, which, for instance, if too reflective, can be made less so either by making the top metal layer thinner or the bottom metal layer thicker.

The present invention is not limited to the preferred embodiments described herein. Various modifications of the deposition conditions, thicknesses, compositions and configurations of the coating of the present invention are included within the scope of the invention as defined by the following claims.

I claim:

1. An article of manufacture comprising:
   a. a transparent substrate;
   b. a titanium oxynitride film deposited on one surface of said substrate of sufficient thickness to produce a colored reflectance from the uncoated surface of said substrate; and
   c. deposited on said titanium oxynitride film and as the exposed layer of a multilayer coating a metal film which controls the transmittance of said article.

2. An article according to claim 1, wherein said substrate is glass.

3. An article according to claim 1, wherein said titanium oxynitride film is a sputtered film.

4. An article according to claim 1, wherein said metal is selected from the group consisting of nickel alloys, iron alloys and titanium.

5. An article according to claim 4, wherein said metal is a nickel alloy.

6. An article according to claim 4, wherein said metal is stainless steel.

7. An article according to claim 4, wherein said metal is titanium.

8. An article according to claim 4, further comprising a second metal film.

9. An article according to claim 8, wherein said titanium oxynitride film is deposited between said first and second metal films.

10. An article according to claim 9, wherein said metal films are selected from the group consisting of nickel alloy, stainless steel, titanium and mixtures thereof.

* * * * *